(12) United States Patent
Li et al.

(10) Patent No.: US 11,374,036 B2
(45) Date of Patent: Jun. 28, 2022

(54) ARRAY SUBSTRATE, MANUFACTURING METHOD THEREOF, AND DISPLAY DEVICE

(71) Applicant: Shenzhen China Star Optoelectronics Semiconductor Display Technology Co., Ltd., Shenzhen (CN)

(72) Inventors: Jia Li, Guangdong (CN); Junling Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/962,070

(22) PCT Filed: Jul. 3, 2020

(86) PCT No.: PCT/CN2020/100036
§ 371 (c)(1),
(2) Date: Jul. 14, 2020

(87) PCT Pub. No.: WO2021/227219
PCT Pub. Date: Nov. 18, 2021

(65) Prior Publication Data
US 2021/0358975 A1    Nov. 18, 2021

(30) Foreign Application Priority Data
May 14, 2020    (CN) .......................... 202010407047.5

(51) Int. Cl.
*H01L 27/12*    (2006.01)
*H01L 25/16*    (2006.01)
*H01L 23/00*    (2006.01)

(52) U.S. Cl.
CPC ........ *H01L 27/1248* (2013.01); *H01L 23/562* (2013.01); *H01L 25/167* (2013.01); *H01L 27/124* (2013.01); *H01L 27/1288* (2013.01)

(58) Field of Classification Search
None
See application file for complete search history.

(56) References Cited

U.S. PATENT DOCUMENTS 9,165,946 B1 * 10/2015 Chang ............... G02F 1/134363
2002/0139567 A1 * 10/2002 Kim ........................ H01L 22/32
174/250

(Continued)

FOREIGN PATENT DOCUMENTS

| CN | 110600497 A | 12/2019 |
|---|---|---|
| CN | 111063693 A | 4/2020 |

OTHER PUBLICATIONS

International search report of PCT application No. PCT/CN2020/100036 dated Nov. 18, 2021 (Year: 2021).*

*Primary Examiner* — Bo B Jang
(74) *Attorney, Agent, or Firm* — The Roy Gross Law Firm, LLC; Roy Gross

(57) ABSTRACT

An array substrate, a manufacturing method thereof, and a display device are provided. The array substrate includes a substrate; an array layer, wherein the array layer includes a conductive pad and a conductive electrode disposed on the substrate; and a scratch prevention layer disposed on a side of the array layer away from the substrate, wherein the scratch prevention layer includes a first hollowed region and a second hollowed region, the first hollowed region corresponds to the conductive pad, and the second hollowed region corresponds to the conductive electrode.

2 Claims, 2 Drawing Sheets

(56) References Cited

U.S. PATENT DOCUMENTS

| | | | | |
|---|---|---|---|---|
| 2013/0001564 A1* | 1/2013 | Choi | ............... | H01L 27/3274 |
| | | | | 257/59 |
| 2014/0027709 A1* | 1/2014 | Higginson | .......... | H01L 25/0753 |
| | | | | 257/13 |
| 2018/0329266 A1* | 11/2018 | Gong | ............... | G02F 1/136227 |
| 2020/0075816 A1 | 3/2020 | Cheng et al. | | |

\* cited by examiner

ARRAY SUBSTRATE, MANUFACTURING METHOD THEREOF, AND DISPLAY DEVICE

FIELD OF INVENTION

The present application relates to the field of display technologies, and in particular to an array substrate, a method of manufacturing same, and a display device.

BACKGROUND OF INVENTION

Development of miniaturized light-emitting diodes has become one of the hotspots of future display technology. Compared with current liquid crystal displays (LCDs) and organic light-emitting diode (OLED) display devices, miniaturized light-emitting diodes have fast response times, high color gamut, high definition (or pixels per inch), low power consumption, and other advantages, but their technical difficulties are many and complex. In particular, their key technologies of mass transfer technology and miniaturization of light-emitting diode (LED) particles have become technical bottlenecks. Meanwhile, a submillimeter light-emitting diode (mini-LED) backplane, as a product of a combination of the miniaturized light-emitting diodes and backplanes, has characteristics of high contrast ratio and rich color gamut performance comparable to organic light-emitting diodes, while its cost is only about 60% of that of organic light-emitting diodes. As it is easier to implement, submillimeter light-emitting diodes have become a hotspot for major panel manufacturers.

The submillimeter light-emitting diode backplane needs to be completed through processes such as cleaning, deposition, gluing, exposure, development, etching, stripping, inspection, and cutting. After the submillimeter light-emitting diode backplane is completed, the submillimeter light-emitting diode backplanes may be scratched or the like during processes of cutting, transferring the submillimeter light-emitting diodes, and bonding a chip-on-film, resulting in poor display due to an occurrence of short circuit and open circuit, which seriously affects an overall product yield.

Therefore, it is necessary to solve the problem that the submillimeter light-emitting diode backplane is easily scratched during the processes of cutting, transferring the submillimeter light-emitting diodes, and bonding the chip-on-film.

SUMMARY OF INVENTION

Technical Problem

The purpose of the present application is to provide an array substrate, a method of manufacturing the same, and a display device, to solve the problem that the array substrate is easily scratched during the processes of cutting, transferring submillimeter light-emitting diodes, and bonding a chip-on-film.

Technical Solution

To achieve the above object, the present application provides an array substrate, the array substrate includes:
a substrate;
an array layer, wherein the array layer includes a conductive pad and a conductive electrode disposed on the substrate, the conductive pad is configured to electrically connect with a driving chip provided to be bound on the array substrate, and the conductive electrode is configured to connect with a light-emitting element provided to be bound on the array substrate; and
a scratch prevention layer disposed on a side of the array layer away from the substrate, wherein the scratch prevention layer includes a first hollowed region and a second hollowed region, the first hollowed region corresponds to the conductive pad, and the second hollowed region corresponds to the conductive electrode.

In the aforementioned array substrate, a preparation material of the scratch prevention layer includes at least one of graphene or modified graphene.

In the aforementioned array substrate, the array layer further includes a thin film transistor, and the scratch prevention layer is disposed corresponding to the thin film transistor.

In the aforementioned array substrate, a Young's modulus of the scratch prevention layer is greater than or equal to 0.1 TPa.

In the aforementioned array substrate, a thickness of the scratch prevention layer ranges from 50 angstroms to 2000 angstroms.

In the aforementioned array substrate, the conductive pad and the conductive electrode are disposed in a same layer.

In the aforementioned array substrate, each of the conductive pad and the conductive electrode includes a first conductive sub-layer and a second conductive sub-layer, the second conductive sub-layer is positioned on a side of the first conductive sub-layer away from the substrate, and the second conductive sub-layer is configured to prevent the first conductive sub-layer from oxidation.

In the aforementioned array substrate, a preparation material of the first conductive sub-layer includes copper or copper alloy, and a preparation material of the second conductive sub-layer includes MoTiNi alloy, MoTi alloy, or MoNi alloy.

In the aforementioned array substrate, the light-emitting element includes a submillimeter light-emitting diode or a micro light-emitting diode.

A method of manufacturing an array substrate, the method including following steps:
forming an array layer on a substrate, wherein the array layer includes a conductive pad and a conductive electrode disposed on the substrate;
forming a scratch prevention layer on a side of the array layer away from the substrate;
removing portions of the scratch prevention layer corresponding to the conductive pad and the conductive electrode to expose the conductive pad and the conductive electrode; and
bonding a chip-on-film to the conductive pad, and bounding a light-emitting element to the conductive electrode, wherein the chip-on-film includes a driving chip, thereby obtaining the array substrate.

In the aforementioned method of manufacturing the array substrate, a preparation material of the scratch prevention layer includes at least one of graphene or modified graphene.

In the aforementioned method of manufacturing the array substrate, a Young's modulus of the scratch prevention layer is greater than or equal to 0.1 TPa.

A display device, the display device including an array substrate, wherein the array substrate includes:
a substrate;
an array layer, wherein the array layer includes a conductive pad and a conductive electrode disposed on the substrate, the conductive pad is configured to electrically connect with a driving chip provided to be bound on the array substrate, and the conductive electrode is configured to connect with a light-emitting element provided to be bound on the array substrate; and a scratch prevention layer disposed on a side of the array layer away from the substrate, wherein the scratch prevention layer includes a first hollowed region and a second hollowed region, the first hollowed region corresponds to the conductive pad, and the second hollowed region corresponds to the conductive electrode.

In the aforementioned display device, a preparation material of the scratch prevention layer includes at least one of graphene or modified graphene.

In the aforementioned display device, the array layer further includes a thin film transistor, and the scratch prevention layer is disposed corresponding to the thin film transistor.

In the aforementioned display device, a Young's modulus of the scratch prevention layer is greater than or equal to 0.1 TPa.

In the aforementioned display device, a thickness of the scratch prevention layer ranges from 50 angstroms to 2000 angstroms.

In the aforementioned display device, the conductive pad and the conductive electrode are disposed in a same layer.

In the aforementioned display device, each of the conductive pad and the conductive electrode includes a first conductive sub-layer and a second conductive sub-layer, the second conductive sub-layer is positioned on a side of the first conductive sub-layer away from the substrate, and the second conductive sub-layer is configured to prevent the first conductive sub-layer from oxidation.

In the aforementioned display device, a preparation material of the first conductive sub-layer includes copper or copper alloy, and a preparation material of the second conductive sub-layer includes MoTiNi alloy, MoTi alloy, or MoNi alloy.

Beneficial Effect

The present application provides an array substrate, a method of manufacturing the same, and a display device. The array substrate includes a substrate; an array layer, wherein the array layer includes a conductive pad and a conductive electrode disposed on the substrate, the conductive pad is configured to electrically connect with a driving chip provided to be bound on the array substrate, and the conductive electrode is configured to connect with a light-emitting element provided to be bound on the array substrate; and a scratch prevention layer disposed on a side of the array layer away from the substrate, wherein the scratch prevention layer includes a first hollowed region and a second hollowed region, the first hollowed region corresponds to the conductive pad, and the second hollowed region corresponds to the conductive electrode. By providing the scratch prevention layer on the side of the array layer away from the substrate, scratches on lines of the array layer during a process of bonding the driving chip and the light-emitting element to the array substrate, which result in poor display of the substrate due to short circuit and open circuit and seriously affect an overall product yield, are prevented.

DETAILED DESCRIPTION OF EMBODIMENTS

Figure 1:
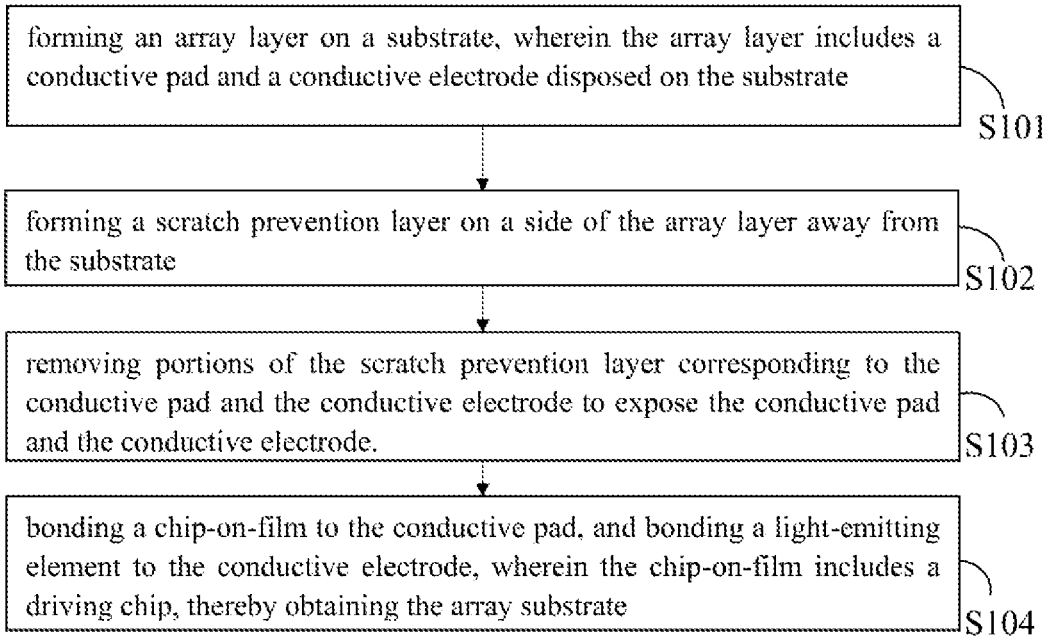
FIG. 1 is a schematic flowchart of a method of manufacturing an array substrate according to an embodiment of the present application.

The following content combines with the drawings and the embodiment for describing the present application in detail. It is obvious that the following embodiments are merely some embodiments of the present application, but not all the embodiments. Based on the embodiments in the present application, for the skilled persons of ordinary skill in the art without creative effort, the other embodiments obtained thereby are still covered by the present application.

The present application provides an array substrate. The array substrate includes:

a substrate;

an array layer, wherein the array layer includes a conductive pad and a conductive electrode disposed on the substrate, the conductive pad is configured to electrically connect with a driving chip provided to be bound on the array substrate, and the conductive electrode is configured to connect with a light-emitting element provided to be bound on the array substrate; and a scratch prevention layer disposed on a side of the array layer away from the substrate, wherein the scratch prevention layer includes a first hollowed region and a second hollowed region, the first hollowed region corresponds to the conductive pad, and the second hollowed region corresponds to the conductive electrode.

The array substrate of the present application forms the scratch prevention layer on the side of the array layer away from the substrate, so as to protect lines of the array layer during processes of cutting, bonding the light-emitting element, and bonding a chip-on-film, and improving a yield of the array substrate.

In some embodiments, a preparation material of the scratch prevention layer includes at least one of graphene or modified graphene. The graphene has advantages of lesser thickness and rigidity, and has good toughness and can be bent. A Young's modulus of the graphene reaches 1.0 TPa and a tensile strength of the graphene is 130 GPa. The modified graphene, such as reduced graphene modified by hydrogen plasma, has good strength and average modulus of 0.25 TPa. Due to the advantages of graphene and graphene modified materials that are hard and tough, the scratch prevention layer is less scratched or damaged during a manufacturing process of the array substrate, and plays a role in preventing the array layer from problems of short circuit or open circuit.

In some embodiments, the scratch prevention layer includes a first scratch prevention layer and a second scratch prevention layer. The first scratch prevention layer has a Young's modulus greater than that of the second scratch prevention layer. The scratch prevention layer is positioned on a side of the second scratch prevention layer away from the substrate, so that the scratch prevention layer has a good scratch-resistant effect and facilitates subsequent process of patterning the scratch prevention layer. For example, a preparation material of the first scratch prevention layer is graphene, and a preparation material of the second scratch prevention layer is reduced graphene. The preparation material of the second scratch prevention layer is reduced graphene, and since reduced graphene has more functional groups than graphene, it is beneficial for improving adhesion between the scratch prevention layer and the array layer. The preparation material of the first scratch prevention layer is graphene, and since graphene has good stability, such as high temperature stability and chemical stability, it is beneficial for improving stability of the scratch prevention layer.

In some embodiments, the array layer further includes a thin film transistor, and the scratch prevention layer is disposed corresponding to the thin film transistor. The array substrate can further include circuits such as data lines and scanning lines to drive the light-emitting element to emit light. The scratch prevention layer is disposed corresponding to the thin film transistor and can protect film layers in the thin film transistor.

In some embodiments, the thin film transistor can be an etch stop type thin film transistor or a back channel thin film transistor. The thin film transistor includes a gate, an active layer, source-drain electrodes, and a gate insulating layer. The gate insulating layer is disposed between the gate and the active layer, and the source-drain electrodes are electrically connected to the active layer.

In some embodiments, the scratch prevention layer has a Young's modulus greater than or equal to 0.1 TPa, so that the scratch prevention layer has a good scratch-resistant effect compared to common inorganic materials such as silicon nitride. A Young's modulus of the scratch prevention layer can be 0.15 TPa, 0.5 TPa, 0.75 TPa, 1 TPa, and 2 TPa.

In some embodiments, a thickness of the scratch prevention layer ranges from 50 angstroms to 2000 angstroms, so that the scratch prevention layer has an anti-scratch effect; in the meantime, it is easier to prepare and time for patterning the scratch prevention layer is shortened, simplifying the process. For example, the thickness of the scratch prevention layer is 100 angstroms, 150 angstroms, 800 angstroms, 1000 angstroms, and 1500 angstroms.

In some embodiments, the conductive pad and the conductive electrode are disposed in a same layer, so that the conductive pad and the conductive electrode can be formed by a same process, which is beneficial for simplifying the process.

In some embodiments, the conductive pad and the conductive electrode each includes a first conductive sub-layer and a second conductive sub-layer, the second conductive sub-layer is positioned on a side of the first conductive sub-layer away from the substrate, and the second conductive sub-layer is configured to prevent the first conductive sub-layer from oxidation, so that the conductive pad and the conductive electrode have good conductivity, and in the meantime, prevent the conductive pad and the conductive electrode from oxidation.

In some embodiments, the first conductive sub-layer is made of copper or copper alloy, and the second conductive sub-layer is made of MoTiNi alloy, MoTi alloy, or MoNi alloy. The second conductive sub-layer is made of MoTiNi alloy so that the conductive pad and the conductive electrode have better oxidation resistance.

In some embodiments, both the conductive pad and the conductive electrode further include a third conductive sub-layer, the third conductive sub-layer is positioned on a side of the first conductive sub-layer close to the substrate, and the third conductive layer is made of Mo or Mo alloy to prevent diffusion when the first conductive sub-layer is a copper layer.

In some embodiments, the light-emitting element is a submillimeter light-emitting diode (mini-LED) or a micro light-emitting diode (micro LED).

The present application also provides a display device. The display device can be a liquid crystal display device. The liquid crystal display device includes a backlight module, and the backlight module includes the above array substrate. The display device can also be an inorganic light-emitting diode display panel, and the inorganic light-emitting diode display panel includes the above array substrate.

The present application further provides a method of manufacturing an array substrate. A flowchart of the method of manufacturing the array substrate is shown in FIG. 1. The method includes following steps:

S101, forming an array layer on a substrate, wherein the array layer includes a conductive pad and a conductive electrode disposed on the substrate.

S102, forming a scratch prevention layer on a side of the array layer away from the substrate.

S103, removing portions of the scratch prevention layer corresponding to the conductive pad and the conductive electrode to expose the conductive pad and the conductive electrode.

S104, bonding a chip-on-film to the conductive pad, and bonding a light-emitting element to the conductive electrode, wherein the chip-on-film includes a driving chip, thereby obtaining the array substrate.

In the method of manufacturing the array substrate of the present application, the scratch prevention layer is formed on the side of the array layer away from the substrate, and the portion of the scratch prevention layer corresponding to the conductive electrode and the conductive pad is removed, and after the conductive electrode and the conductive pad are exposed, the light-emitting element is bound to the conductive electrode, and the chip-on-film is bound to the conductive pad to prevent damage to the lines on the array layer during the processes of bonding the light-emitting element and the chip-on-film, improving the yield of the product.

The method of manufacturing the array substrate will be described in detail below by taking the thin film transistor as a back channel etching thin film transistor as an example.

Figure 2A:
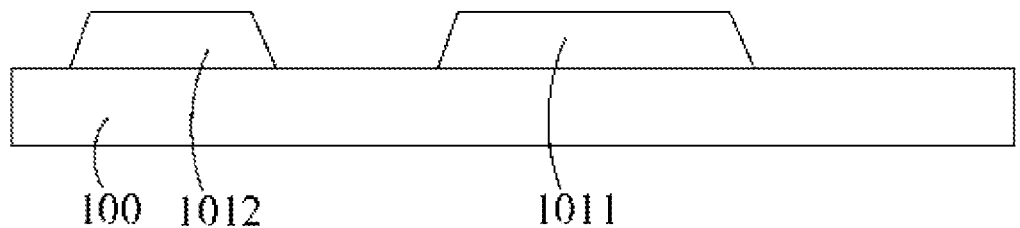
FIGS. 2A-2D are schematic diagrams showing the flowchart of the method of manufacturing the array substrate according to the embodiment of the present application.

S201, as shown in FIG. 2A, a gate and a first conductive member are formed on a substrate.

Specifically, an entire surface of a first conductive layer is formed on the substrate 100, and the first conductive layer is patterned using a first photolithography process to obtain the gate electrode 1011 and the first conductive member 1012. The first photolithography process includes forming a photoresist layer on the entire surface of the first conductive layer, exposing the photoresist layer with a first photomask, developing with a developing solution to etch the first conductive layer not covered by the photoresist layer, and stripping the remaining photoresist layer. The first conductive layer includes a layer of molybdenum or molybdenum alloy and a layer of copper or copper alloy sequentially stacked on the substrate 100. For example, the first conductive layer is a molybdenum layer and a copper layer sequentially stacked on the substrate 100.

Figure 2B:
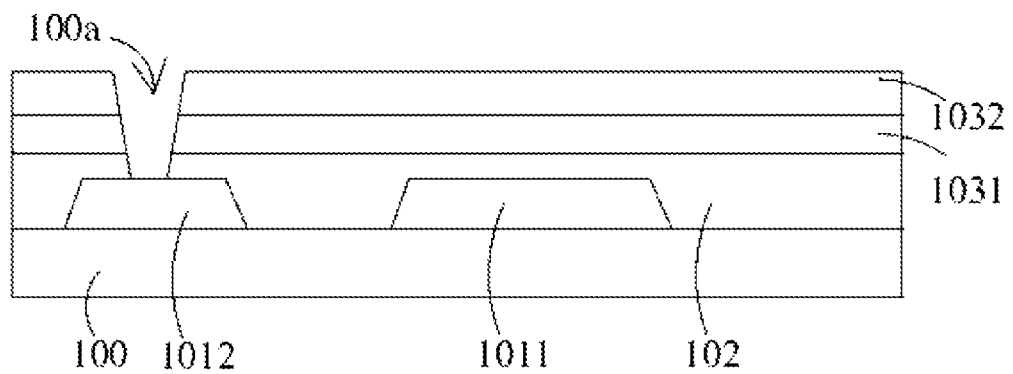

S202, as shown in FIG. 2B, forming a gate insulating layer and a semiconductor layer covering the gate, the first conductive member, and the substrate, sequentially. And, forming a first contact hole in the gate insulating layer and the semiconductor layer corresponding to the first conductive member.

Specifically, after the gate insulating layer 102 entirely covering the gate 1011, the first conductive member 1012, and the substrate 100 is formed, the semiconductor layer is entirely formed on the gate insulating layer 102. A material for preparing the gate insulating layer 102 is silicon nitride. The semiconductor layer includes an amorphous Si (a-Si) layer 1031 and an n-doped a-Si layer 1032. The n-doped a-Si layer 1032 is positioned on a side of the gate insulating layer away from the substrate 100. Then, through a second photolithography process of photoresist coating, exposure, development, etching, and stripping, a first contact hole 100a penetrating the semiconductor layer and the gate insulating layer 102 is formed above the first conductive member 1012.

Figure 2C:
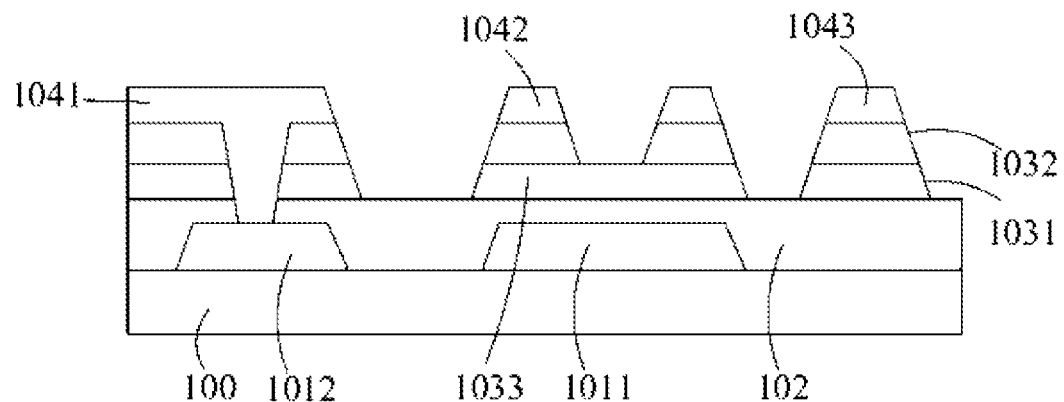

S203, as shown in FIG. 2C, a second conductive layer is entirely formed in the first contact hole and on the semiconductor layer, and a second conductive member, an active layer, source-drain electrodes, and a conductive pad are formed by a patterning process. The second conductive member is in contact with the first conductive member through the first contact hole, and the source-drain electrodes are in contact with the active layer.

Specifically, after forming the second conductive layer entirely in the first contact hole 100a and on the semiconductor layer, a half-tone gray-scale mask (half tone) process, and twice dry etching process and twice wet etching process are adopted to obtain the second conductive member 1041, the active layer 1033, the source-drain electrodes 1042, and the conductive pad 1043. The second conductive member 1041 is in contact with the first conductive member 1012 through the first contact hole 100a, and the source-drain electrodes 1042 are in contact with the active layer 1033. The second conductive layer includes a Mo layer, a copper layer, and a MoTiNi alloy layer sequentially stacked on the semiconductor layer.

The half-tone gray-scale mask (half tone) process is used to form a photoresist layer entirely covering the second conductive layer, and then using the half-tone gray-scale mask to define a photoresist full maintaining region and a photoresist half maintaining region, and a photoresist completely removed region. Wherein, positions where the second conductive member 1041, the source-drain electrodes 1042, and the conductive pad 1043 are to be formed correspond the photoresist full maintaining region. Position where a channel of the active layer 1033 is to be formed corresponds the photoresist half maintaining region. A region between a source electrode of the source-drain electrodes 1042 to be formed and the second conductive member 1041 to be formed, and a region between a drain electrode of the source-drain electrode 1042 to be formed and the conductive electrode 1043 to be formed correspond the photoresist completely removed region. A first dry etching is to etch the second conductive layer positioned in the photoresist completely removed region, and a first wet etching is to etch the semiconductor layer positioned in the photoresist completely removed region. A second dry etching is to etch the second conductive layer positioned in the photoresist half maintaining region, and a second wet etching is to etch the n-doped a-Si layer 1032 positioned in photoresist half maintaining region.

Figure 2D:
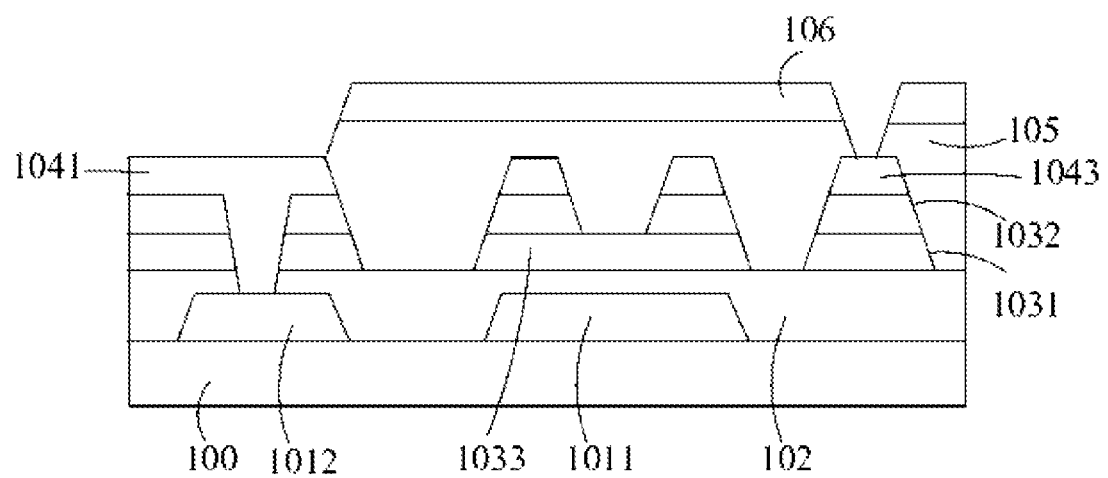

S204, as shown in FIG. 2D, sequentially forming a passivation layer and a scratch prevention layer covering the second conductive member, the source-drain electrodes, the conductive pad, and the gate insulating layer, and removing portion of the passivation layer and the scratch prevention layer corresponding to the second conductive member and the conductive pad.

Specifically, a passivation layer 105 entirely covering the second conductive member 1041, the source-drain electrodes 1042, the conductive pad 1043, and the gate insulating layer 102 is formed, and the scratch prevention layer 106 is entirely formed on the passivation layer 105. A third photolithography process is adopted to remove the passivation layer 105 and the scratch prevention layer 106 corresponding to the second conductive member 1041 and the conductive pad 1043, so that the second conductive member 1041 and the conductive pad 1043 are exposed. The passivation layer 105 is made of at least one of silicon nitride or silicon oxide. The scratch prevention layer 106 is made of graphene or modified graphene.

S205, bonding the light-emitting element to the conductive electrode, and bonding the chip-on-film to the second conductive member.

Embodiments of the present invention have been described, but not intended to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A method of manufacturing an array substrate, comprising following steps:
    forming an array layer on a substrate, wherein the array layer comprises a conductive pad and a conductive electrode disposed on the substrate;
    forming a passivation layer on a side of the array layer away from the substrate, wherein the passivation layer entirely covers the conductive pad;
    forming a scratch prevention layer on the passivation layer, wherein the scratch prevention layer serves as an external layer of the array layer configured to cover and protect the array layer from scratches, and a material of the scratch prevention layer comprises at least one of graphene or modified graphene;
    removing portions of the passivation layer and the scratch prevention layer corresponding to the conductive pad and the conductive electrode to expose the conductive pad and the conductive electrode; and
    bonding a chip-on-film to the conductive pad, and bounding a light-emitting element to the conductive electrode, wherein the chip-on-film comprises a driving chip, thereby obtaining the array substrate.

2. The method of manufacturing the array substrate of claim 1, wherein a Young's modulus of the scratch prevention layer is greater than or equal to 0.1 TPa.

* * * * *